United States Patent [19]

Williams et al.

[11] Patent Number: 4,985,473
[45] Date of Patent: Jan. 15, 1991

[54] COMPOSITIONS FOR PROVIDING ABHERENT COATINGS

[75] Inventors: Brian Howard Williams, White Bear Lake; Chung-I Young, Roseville, both of Minn.

[73] Assignee: Minnesota Mining and Manufacturing Company, St. Paul, Minn.

[21] Appl. No.: 195,483

[22] Filed: May 17, 1988

Related U.S. Application Data

[60] Continuation of Ser. No. 907,141, Sep. 12, 1986, abandoned, which is a continuation of Ser. No. 311,274, Oct. 14, 1981, abandoned, which is a division of Ser. No. 151,644, May 20, 1980, Pat. No. 4,321,404.

[51] Int. Cl.$^5$ ............... C08F 251/02; C08F 265/06; C08F 279/06; C08F 291/18
[52] U.S. Cl. ............... 522/89; 522/72; 522/93; 522/95; 522/96; 522/97; 522/121; 522/136; 522/137; 525/276; 525/404; 525/411; 525/440; 527/312
[58] Field of Search ............... 525/276, 404, 411, 440; 522/72, 89, 93, 95, 96, 97, 121, 136, 137

[56] References Cited

U.S. PATENT DOCUMENTS

| | | | |
|---|---|---|---|
| 2,642,416 | 6/1953 | Ahlbrecht et al. | 260/83.5 |
| 2,803,615 | 8/1957 | Ahlbrecht et al. | 260/29.6 |
| 3,068,187 | 12/1962 | Bolstad et al. | 260/29.6 |
| 3,099,558 | 7/1963 | Levinos | 96/35 |
| 3,102,103 | 8/1963 | Ahlbrecht et al. | 260/29.6 |
| 3,171,861 | 3/1965 | Ahlbrecht | 260/633 |
| 3,250,807 | 5/1966 | Fritz et al. | 260/535 |
| 3,250,808 | 5/1966 | Moore, Jr. et al. | 260/535 |
| 3,384,627 | 5/1968 | Anello et al. | 260/89.5 |
| 3,419,602 | 12/1968 | Pittman et al. | 260/486 |
| 3,457,274 | 7/1969 | Katsushima et al. | 260/89.5 |
| 3,505,229 | 4/1970 | Skehan | 252/54 |
| 3,699,145 | 10/1972 | Siasesi et al. | 260/463 |
| 3,719,698 | 3/1973 | Tesore et al. | 260/448.8 R |
| 3,729,313 | 4/1973 | Smith | 96/27 R |
| 3,810,874 | 5/1974 | Mitsch et al. | 260/75 H |
| 3,810,875 | 5/1974 | Rice et al. | 260/899 |
| 3,814,741 | 6/1974 | Caporiccio et al. | 260/86.1 E |
| 3,818,074 | 6/1974 | Ahlbrecht | 260/486 |
| 3,833,384 | 9/1974 | Noonan et al. | 96/115 P |
| 3,838,104 | 9/1974 | Hayashi et al. | 260/63 HA |
| 3,882,193 | 5/1975 | Rice et al. | 260/874 |
| 3,885,964 | 5/1975 | Nacci | 96/35.1 |
| 3,887,450 | 6/1975 | Gilano et al. | 204/159.15 |
| 3,895,949 | 7/1975 | Akamatsu et al. | 96/86 P |
| 3,907,574 | 9/1975 | Yonezawa et al. | 96/115 P |
| 3,975,352 | 8/1976 | Yoerger et al. | 260/33.8 F |
| 3,981,928 | 9/1976 | Pavlik | 260/615 F |
| 3,997,702 | 12/1976 | Schurb et al. | 428/352 |
| 4,037,021 | 7/1977 | Adams | 428/522 |
| 4,043,819 | 8/1977 | Baumann | 96/115 P |
| 4,058,401 | 11/1977 | Crivello | 96/115 R |
| 4,170,687 | 10/1979 | Spicer et al. | 428/421 |
| 4,171,397 | 10/1979 | Morrow | 428/195 |
| 4,176,212 | 11/1979 | Brack | 522/96 |
| 4,218,294 | 8/1980 | Brack | 204/159.13 |
| 4,292,029 | 9/1981 | Craig et al. | 525/276 |

FOREIGN PATENT DOCUMENTS

| | | |
|---|---|---|
| 2453871 | 11/1980 | France . |
| 892818 | 3/1962 | United Kingdom . |
| 2019254 | 10/1979 | United Kingdom . |
| 1564542 | 4/1980 | United Kingdom . |

OTHER PUBLICATIONS

Research Disclosure, vol. 177, No. 118, Feb. 1974, pp. 24–28.
"Mold Release Agents" by Frank Axel, pp. 85–96 of *Unsaturated Polyester Technology*, Gordon and Breach Science Publishers, New York, N.Y. (1976).
"Abherents," pp. 1–9 of *Kirk–Othmer Encyclopedia of Chemical Technology*, Third Edition, vol. 1, John Wiley & Sons, New York, N.Y.

Primary Examiner—Marion E. McCamish
Assistant Examiner—Arthur H. Koeckert
Attorney, Agent, or Firm—Donald M. Sell; Walter N. Kirn; Jennie C. Boeder

[57] ABSTRACT

Radiation curable coating compositions for providing solvent-resistant abhesive coatings comprise polyfluorinated acrylates and methacrylates, polyethylenically unsaturated crosslinking agents and a film-forming organic polymer. The compositions can be used after radiation curing to render substrates oil, soil, and water repellent. The cured compositions have particular use as release coatings in image transfer systems wherein a fused xerographic image is transferred from the release coated surface, to another surface due to the particular characteristics of the coatings. Novel poly(fluorooxyalkylene)urethane acrylate compounds are also disclosed.

14 Claims, No Drawings

COMPOSITIONS FOR PROVIDING ABHERENT COATINGS

This is a continuation of application Ser. No. 907,141 filed Sept. 12, 1986, now abandoned, which is a continuation of Ser. No. 311,274, filed Oct. 14, 1981, now abandoned, which is a divisional of Ser. No. 151,644, filed May 20, 1980, now U.S. Pat. No. 4,321,404.

The present invention relates to unique radiation curable abherent coating compositions for providing solvent-resistant abhesive coatings and to substrates coated with same. More particularly, the invention relates to radiation crosslinked coatings and films having polyfluorinated groups incorporated therein to a high degree. The invention further relates to a method for providing such abherent coatings and films, and to particularly preferred novel poly(fluorooxyalkylene-)urethane acrylate compounds useful in said coating compositions.

Abhesive coatings are used in applications where adhesion between the surfaces of two materials is to be controlled. Such applications include industrial operations such as die casting, injection and blow molding, melt spinning, vacuum forming, stamping and the like. Yet another application is in the area of transfer adhesives wherein a solvent based adhesive is applied to an abhesive coated release surface to which the adhesive weakly adheres. The adhesive surface of the composite structure is applied to another receiver surface and the abhesive release backing is peeled away to expose the adhesive material for a variety of desired applications. Still another application is in the area of image transfer, wherein an abhesive coated surface is printed with a design which, due to the release properties of the abhesive coating, can be transferred to another substrate, generally by heat and pressure.

Abhesive materials known in the art of industrial operations include liquid or powdered solid materials such as silicones, fluorocarbon containing polymers, waxes, stearates, talc, mica, graphite and the like. U.S. Pat. No. 2,803,615 discloses certain polyacrylate and polymethacrylate fluorocarbon polymers which are of use in rendering fabrics oil and water resistant, and for a number of other purposes. Several of the abhesive materials known in the art, in particular stearates, are monomeric substances which are easily removed from the substrate and therefore are of use for only limited periods as abherent coatings. Others of these materials, in particular paraffin waxes and certain fluorocarbon polymers are not solvent resistant and therefore not useful as release coatings in transfer adhesive systems for solvent based adhesives. Others of the commonly known abhesive materials, in particular, silicones and fluorocarbons (e.g., Teflon ®) have not been particularly useful as release coatings in image transfer systems where the image applied to the release surface is a fused xerographic one, since they produce surfaces which have such low adhesion characteristics that the image is easily smeared, such as by finger pressure.

The radiation curable abhesive coating compositions of the present invention comprise:
(a) a polyfluorinated acrylate compound;
(b) a polyethylenically unsaturated crosslinking agent; and
(c) a film-forming organic polmer.

The present invention is an advance over the prior art in that it provides novel radiation curable compositions for providing solvent-resistant abhesive coatings having characteristics which make them of particular use as abherent release coatings in the area of image transfer, in particular, wherein the image to be transferred is a fused xerographic one. The cured compositions of the present invention provide abherent surfaces which can carry an image, in particular a fused xerographic image, which is not easily smeared, yet is easily removed by a variety of methods.

An important aspect of the present invention is the discovery that even a relatively small amount of the polyfluorinated acrylate compound, which generally is much more expensive than the polymeric binder, provides cured compositions having a surprisingly high degree of abhesiveness. Thus, the compositions of the present invention function as a unique and comparatively inexpensive replacement for costly fluoropolymers sometimes used to provide abherent surfaces.

While we do not wish to be bound by any theory, it is thought that the ability to use small amounts of polyfluorinated acrylate to provide cured compositions having such high levels of abhesiveness is due to the ease with which the acrylate compound migrates to the surface of the coating composition prior to radiation curing. Once migration of the compound to the surface has occurred it is incorporated to a high degree into the crosslinked network of the coating by radiation curing. The resultant cured coating has a highly florinated low adhesion exposed surface despite the fact that only a relatively small amount of polyfluorinated acrylate monomer has been utilized.

Another important aspect of the present invention is that the composition, once coated on a suitable substrate and radiation cured, provides the substrate with a coating which is abhesive on its exposed surface yet adheres tenaciously to the substrate. Thus, the abherent coatings of the present invention are not easily removed from the substrate, even by strong solvents, and can provide the substrate with an abherent surface for a relatively long period of time. The fact that the coating adheres strongly to the substrate is further support for the theory that the polyfluorinated acrylate groups are concentrated on the exposed surface of the coating composition.

The coating compositions of the present invention, once radiation cured, are highly resistant to all known solvents including such harsh solvents as tetrahydrofuran and trifluoroethanol. This property is of particular advantage when the abhesive surface is to be used with solvent based adhesives, such as in transfer adhesive systems.

The coating compositions of the present invention can be cured without the need for thermal polymerization processes. The desirability of radiation sensitive compositions has long been recognized since the energy requirements are usually minimal when compared to those of conventional heat curing processes. In addition, conventional thermal polymerization processes require that the polymerization materials and the substrates be heat insensitive.

The polyfluorinated acrylate compound should contain sufficient fluorine to provide the total composition with at least about 0.05% by weight fluorine. This minimum amount of fluorine is necessary to provide suitable abhesive characteristics.

The abhesive characteristics of the radiation cured coatings can be measured by a solvent based adhesive peel strength test (designated hereinafter as "180°-S-

Peel"). Basically, "180°-S-Peel" strength is the force required to remove a solvent based acrylic adhesive from a substrate coated with a radiation cured abhesive coating of the present invention.

The cured coatings of the present invention generally provide abherent surfaces having "180°-S-Peel" strengths within a range taught to be useful by the prior art, i.e., between about 115 and 725 grams per centimeter (about 10 to 65 ounces per inch).

Examples of polyfluorinated acrylate compounds particularly suitable for use in the compositions of the present invention include polyfluorinated alkyl acrylates and methacrylates, and poly(fluorooxyalkylene)acrylates and methacrylates.

Preferred polyfluorinated alkyl acrylates and methacrylates have the general formula:

$$R_f\text{---}X\text{---}A \qquad \text{I}$$

wherein:

$R_f$ is a polyfluorinated saturated, monovalent, nonaromatic, aliphatic radical that is straight, branched or cyclic;

A is an ethylenically unsaturated group having the formula:

$$-\text{O}-\underset{\underset{R}{|}}{\overset{\overset{O}{\|}}{C}}-C=CH_2, \qquad \text{Ia}$$

$$-\text{O}-\overset{\overset{O}{\|}}{C}NH\text{+}CH_2\text{)}_{\overline{a}}\text{O}-\underset{\underset{R}{|}}{\overset{\overset{O}{\|}}{C}}-C=CH_2, \text{ or} \qquad \text{Ib}$$

$$-\text{O}-\overset{\overset{O}{\|}}{C}NH-R'-NHCO\text{+}CH_2\text{)}_{\overline{a}}O\underset{\underset{R}{|}}{\overset{\overset{O}{\|}}{C}}-C=CH_2 \qquad \text{Ic}$$

wherein:

R is hydrogen or methyl;

a is an integer having a value of 2 to 6; and

R' is a divalent aliphatic or cycloaliphatic group having 2 to 14 carbon atoms or an aryl group having 6 to 14 carbon atoms; and X is a connecting group selected from the group consisting of:

$$-SO_2-\underset{\underset{}{|}}{\overset{R^2}{N}}\text{+}CH_2\text{)}_{\overline{b}}, \qquad \text{Id}$$

$\text{+}CH_2\text{)}_{\overline{b'}}$ and  \qquad Ie

-continued $$-\overset{\overset{O}{\|}}{C}-\underset{\underset{}{|}}{\overset{R^2}{N}}\text{+}CH_2\text{)}_{\overline{b}} \qquad \text{If}$$

wherein:

b is 2 to 12; b' is 1 to 12;

$R^2$ is hydrogen, a lower alkyl of about 1 to 4 carbon atoms (preferably methyl or ethyl), or $\text{+}CH_2\text{)}_{\overline{c}}A$, wherein A is defined above, c is 2 or 3, and wherein when $R^2$ is $\text{+}CH_2\text{)}_{\overline{c}}A$, b is 2 or 3;

and when $R_f$ contains 6, 7 or more than 7 carbon atoms there are no more than 6, 10 or 20 atoms respectively in the chain between $R_f$ and the ester oxygen of the acrylate or methacrylate group.

Preferably, $R_f$ is fully fluorinated; however, desired release characteristics can be obtained with hydrogen or chlorine atoms present as substituents in the radical provided that not more than one atom of either is present for every two carbon atoms in the radical. $R_f$ preferably contains 6 to 14 carbon atoms, and most preferably, 8 to 10 carbon atoms.

The preferred compounds of Formula I are those compounds in which the connecting group X is $$-SO_2-\underset{\underset{}{|}}{\overset{R^2}{N}}\text{+}CH_2\text{)}_{\overline{b}} \qquad \text{(Id)}$$

The compounds of Formula I are prepared by the reaction of an $R_fOH$, such as a fluoroalkylsulfonamidoalkanol, a fluoroalkanol, or a fluoroalkylcarbonamidoalkanol, with the halide, anhydride, or lower alkyl ester of acrylic or methacrylic acid, an isocyanatoalkyl acrylate or methacrylate, or the reaction product of one mole of an organic diisocyanate and one mole of a hydroxyalkyl acrylate or methacrylate.

Examples of compounds of Formula I in which X is of the Formula Id and A is of the Formula Ia are disclosed in U.S. Pat. No. 2,803,615. Examples include:

3-(N-methylperfluorooctanesulfonylamido)propyl acrylate, 2-(N-ethylperfluorooctanesulfonylamido)ethyl acrylate, 2-(N-ethylperfluorooctadecanesulfonylamido)ethyl acrylate, and 4-(N-butylperfluorohexanesulfonylamido)butyl methacrylate.

Examples of compounds of Formula I in which X is of the Formula Id and A is of the Formula Ib or Ic include:

3-(N-methylperfluorooctanesulfonamido)propyl 2-acryloyloxyethylcarbamate, 2-(N-ethylperfluorodecanesulfonamido)ethyl 2-acryloyloxyethylcarbamate, $$C_8F_{17}SO_2NH\text{---}CH_2CH_2\text{---}O\overset{\overset{O}{\|}}{C}NH\text{---}\underset{}{\overset{CH_3}{\bigcirc}}\text{---}NH\overset{\overset{O}{\|}}{C}O\text{---}CH_2CH_2O\overset{\overset{O}{\|}}{C}\text{---}CH=CH_2,$$

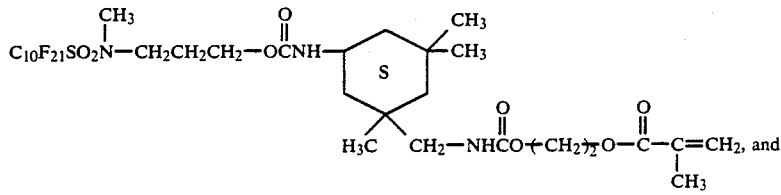

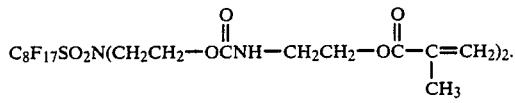

Examples of compounds of Formula I in which X is of the Formula Ie and A is of the Formula Ia are disclosed in U.S. Pat. Nos. 2,642,416; 3,384,627; 3,419,602; 3,719,698; 3,981,928; 3,102,103; 3,171,861; and 3,818,074. Examples include:
3-perfluorooctylpropyl acrylate,
perfluoroheptylmethyl acrylate,
12-perfluorooctyldodecyl methacrylate,
6-perflurodecylhexyl acrylate,
3-perflurooctyl-2-chloropropyl acrylate,
3-perfluorooctylpentyl methacrylate, and
1,2,2-trihydro-1-methylheneicosafluorododecyl acrylate.

Examples of compounds of Formula I in which X is of the Formula Ie and A is of the Formula Ib or Ic include:
perfluoroheptylmethyl 2-acryloyloxyethylcarbamate,
perfluorononylmethyl 2-methacryloyloxypropylcarbamate, and

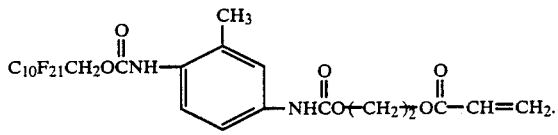

Examples of compounds of Formula I in which X is of the Formula If and A is of the Formula Ia, Ib or Ic include:
2-(perfluoroheptylcarbonamido)ethyl acrylate,

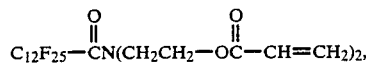

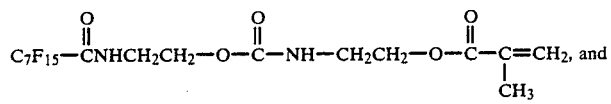

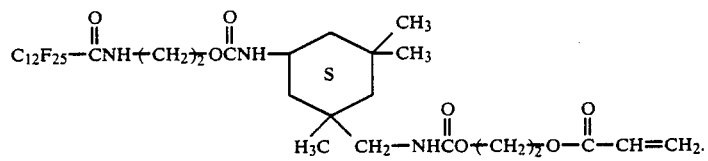

When polyfluorinated alkyl acrylates and methacrylates such as those described by Formula I are utilized, there is present in the coating composition preferably 1 to 70 percent by weight of polyfluorinated acrylate compound, more preferably 3–45 percent by weight, and most preferably 5–25 percent by weight.

Preferred poly(fluorooxyalkylene) acrylates and methacrylates have the general formula:

$$Z-R_f^2-Y-A \qquad II$$

wherein:
A is as it was defined for Formula I, i.e. Formulas Ia, Ib and Ic;
Y is $$-CH_2- \quad \text{or} \quad \underset{\underset{\displaystyle -C-N+CH_2\rightarrow_b}{\overset{\displaystyle O \quad R^2}{\parallel \quad |}}}{}$$

wherein:
b is 2 to 12, $R^2$ is hydrogen, a lower alkyl of about 1 to 4 carbon atoms (preferably methyl or ethyl), or $-(CH_2)_c-A$, wherein A is defined above, c is 2 or 3, and wherein when $R^2$ is $-(CH_2)_c-A$, b is 2 or 3;

$R_f^2$ is a divalent poly(fluorooxyalkylene) group having a number average molecular weight of from about 500 to 20,000 or higher and, preferably, about 2,000 to 10,000, as disclosed in U.S. Pat. No. 3,810,874; and Z is $CF_3O-$, $CF_3OCF(CF_3)O-$, or $-Y-A$, where Y and A are defined as they were above.

$R_f^2$ preferably comprises highly fluorinated polyethers having randomly distributed units selected from $-CF_2O-$, $-CF_2CF_2O-$ and $-C_3F_6O-$, and may also have incorporated therein $-CF_2-CF_2-CF_2-CF_2-O-$, $-CF_2-$ and $-C_2F_4-$ groups. Examples of such $R_f^2$ backbones are disclosed in U.S. Pat. Nos. 3,250,807; 3,250,808; 3,505,229; 3,699,145; 3,810,874; 3,810,875; 3,814,741; and 3,882,193. Most preferably $R_f^2$ comprises the unit, $-CF_2+O-CF_2CF_2O)_m+CF_2O)_nCF_2-$ wherein m and n are whole numbers having a value of about 1 to 200, and designate the number of randomly distributed perfluorooxyethylene and perfluorooxymethylene backbone repeating subunits, respectively, and the ratio m/n is between about 0.2/1 and 5/1.

The compounds of Formula II are prepared by the reaction of a poly(fluorooxyalkylene)methanol or a poly(fluorooxyalkylene)amidoalkanol with the halide, anhydride, or lower alkyl ester of acrylic or methacrylic acid, an isocyanatoalkyl acrylate or methacrylate, or the reaction product of one mole of an organic diisocyanate and one mole of a hydroxy alkyl acrylate or methacrylate.

Examples of compounds of Formula II wherein Y is —CH$_2$—, A is of the Formula Ia, and Z is CF$_3$O— or CF$_3$OCF(CF$_3$)O—, are disclosed in U.S. Pat. No. 3,814,741, and include:

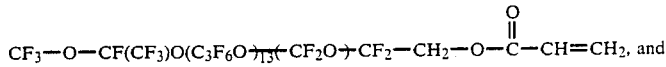

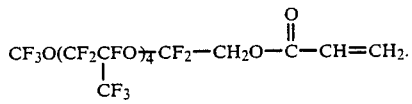

Examples of compounds of Formula II wherein Y is —CH$_2$—, is of the Formula Ib or Ic, and Z is CF$_3$O or CF$_3$OCF(CF$_3$)O— include:

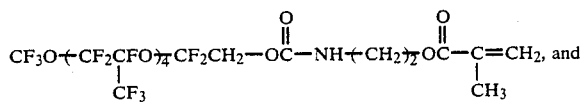

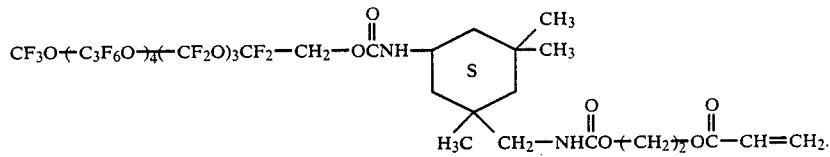

Examples of compounds of Formula II wherein Y is of the Formula If, A is of the Formula Ia, Ib or Ic, and Z is CF$_3$O— or CF$_3$OCF(CF$_3$)O— include:

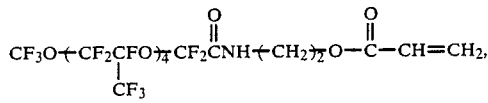

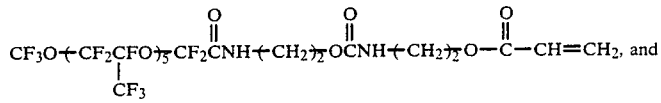

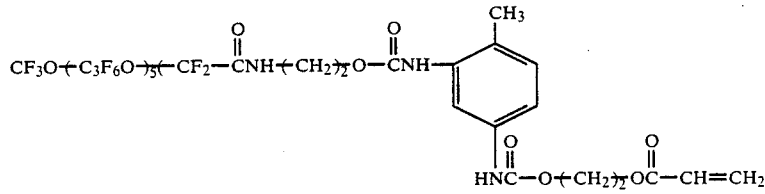

Examples of compounds of Formula II wherein Y is —CH$_2$— or of the Formula If, A is of the Formula Ia, Ib or Ic, and Z is —Y—A, where Y and A are defined as they were hereinabove, include:

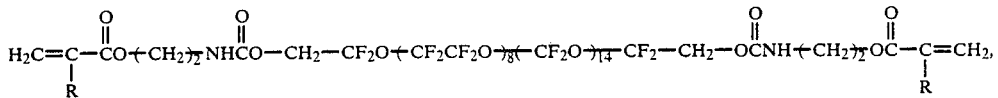

-continued
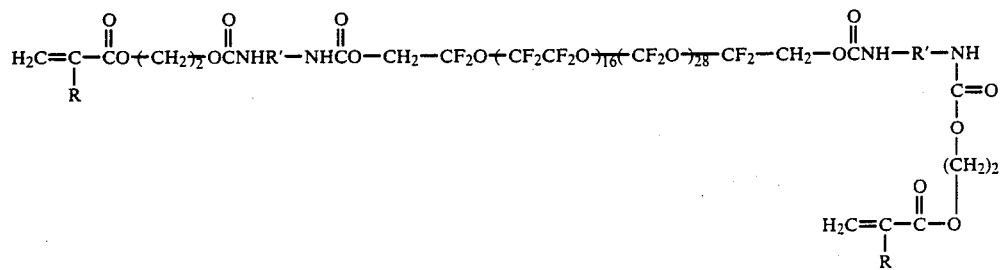
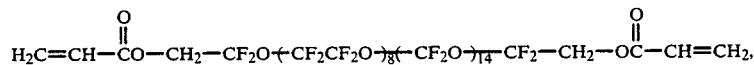
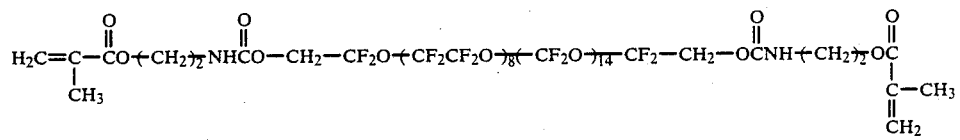
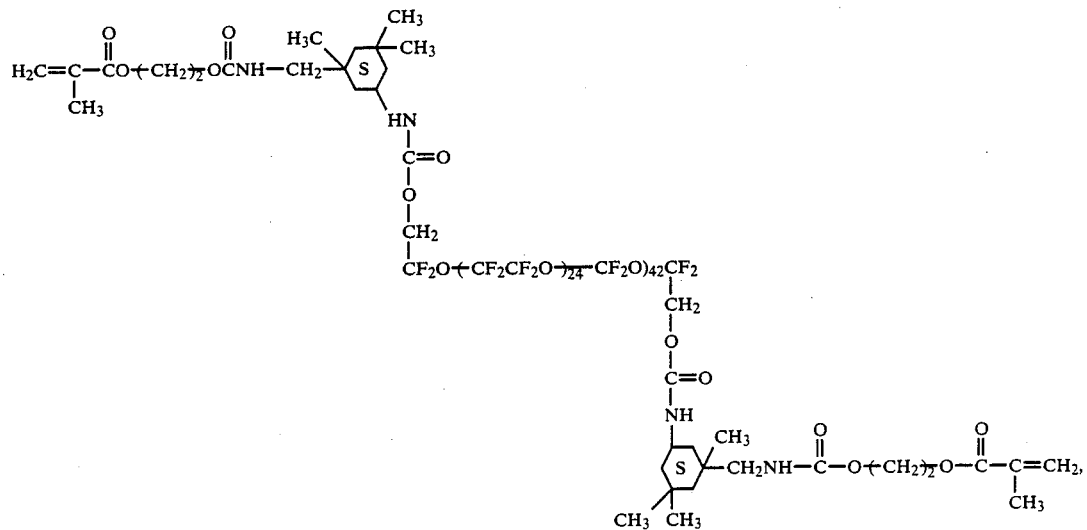
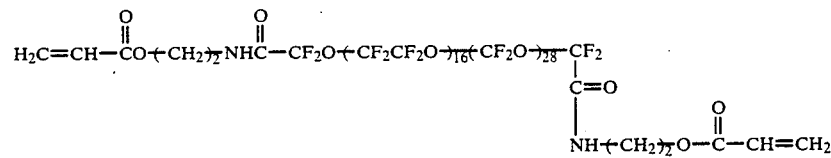
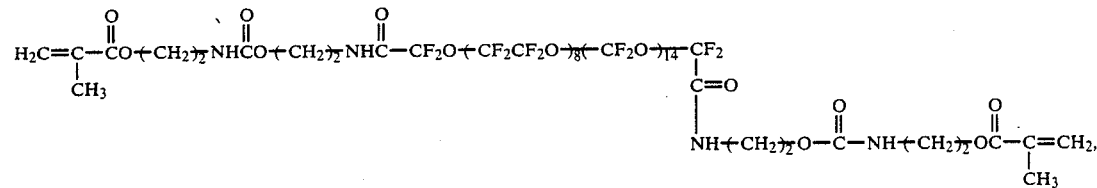
and

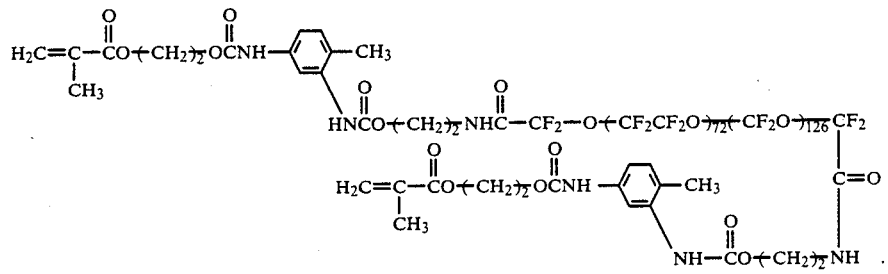

Particularly preferred poly(fluorooxyalkylene) acrylates and methacrylates are compounds of Formula II wherein A is

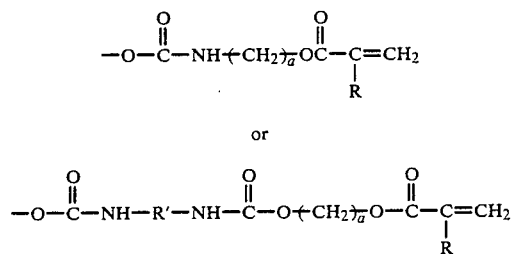

wherein a, R, and R' are defined as above. These compounds belong to the class of poly(fluorooxyalkylene)urethane acrylate compounds, and are believed to be novel. Exemplary of these novel urethane acrylate compounds are:

they are easier to prepare, and therefore more economical, more compatible with the other components of the radiation curable compositions of the invention, and generally highly reactive therewith.

When the poly(fluorooxyalkylene acrylates and methacrylates described by Formula II are utilized, there is present in the radiation curable abherent coating composition preferably about 0.1 to 20 percent by weight of the polyfluorinated acrylate material, more preferably about 0.15 to 10 percent by weight, and most preferably about 0.2 to 5 percent by weight.

Exemplary polyethylenically unsaturated crosslinking agents for inclusion in the radiation curable compositions of the present invention include acrylic and methacrylic substituted compounds having an acrylic equivalent weight of about 63 to 275, preferably about 85 to 200 and more preferably about 100 to 150. Such agents are well-known and are listed, for example, in U.S. Pat. Nos. 3,833,384; 3,885,964; and 4,037,021. Preferred crosslinking agents include acrylic anhydride,

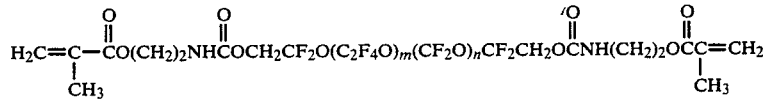

wherein m/n has an average value of about 0.5 and wherein the compound has a number average molecular weight of about 4690;

methacrylic anhydride, polyacrylate and polymethacrylate esters of alkanepolyols, and the polyacrylate and polymethacrylate esters of isocyanurate and s-tria-

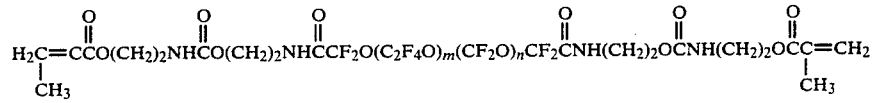

wherein m/n has an average value of about 0.6 and wherein the compound has a number average molecular weight of about 2310; and zines (e.g., tris(2-acryloyloxyethyl)isocyanurate, available as "SR ®-368" from the Sartomer Co., West Chester, PA, and 1,3,5-tri(2-methacryloxyethyl)-s-triazine).

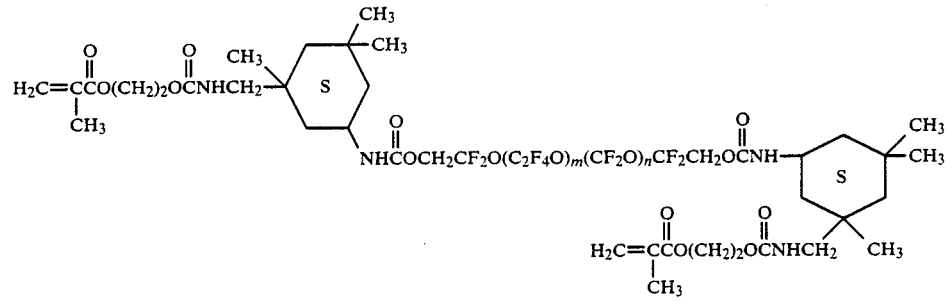

wherein m/n has an average value of about 0.5, and the number average molecular weight of the compound is about 5450. These compounds are preferred because Preferably, there is present in the coating compositions about 10 to 62 percent by weight, more preferably about 15 to 50 percent by weight and most preferably about 20 to 30 percent by weight polyethylenically unsaturated crosslinking agent.

Film-forming polymers suitable for use in the compositions of the invention are generally thermoplastic organic polymers containing carbon and hydrogen and optionally oxygen, nitrogen and halogens, i.e., chlorine. In order to be of use in the present invention the film-forming polymer must be compatible and dispellable with the polyfluorinated acrylate compound. Suitable polymers are those polymers that:
1. are soluble in tetrahydrofuran; and
2. do not exhibit immediate phase separation when the polyfluorinated acrylate compound is dispelled into a solution of the polymer in tetrahydrofuran.

Examples of suitable polymers include: polyesters, e.g. polyethylene terephthalate; copolyesters, e.g. polyethylene terephthalate isophthalate; polylactones, e.g. polycaprolactone; polyamides, e.g. polyhexamethylene adipamide; vinyl polymers, e.g. poly(vinyl acetate/methyl acrylate), poly(vinylidene chloride/vinyl acetate); polyolefins, e.g. polystyrene; polydienes, e.g. poly(butadiene/styrene); polyacrylates, e.g. poly(methyl methacrylate/ethyl acrylate), poly(methyl acrylate/acrylic acid); polyurethanes, e.g. reaction products of aliphatic, cycloaliphatic or aromatic diisocyanates with polyester glycols or polyether glycols; and cellulosic derivatives, e.g. cellulose ethers such as ethyl cellulose, esters such as cellulose acetate/butyrate.

Preferably, there is present in the radiation curable coating composition, about 5 to 85 percent by weight, more preferably about 30 to 80 percent by weight, and most preferably about 50 to 70 percent by weight film-forming organic polymer.

The coating compositions are preferably prepared by dispelling the film-forming polymer, the polyethylenically unsaturated crosslinking agent and the polyfluorinated acrylate compound in a suitable solvent. A particularly preferred method of preparing the coating composition is by first dissolving the polymer in a suitable solvent and then adding the crosslinking agent and the polyfluorinated acrylate compound to the solution. Generally, solutions having concentrations of solids of about 20 to 40 percent by weight are preferred, although higher or lower concentrations can be used, depending upon whether the viscosity of the solution is suitable for coating onto a substrate. The preferred solvent is tetrahydrofuran. Other suitable solvents include dimethyl formamide, cyclohexanone, methyl isobutyl ketone, methyl ethyl ketone, and similar polar aprotic solvents.

Various additives, such as coating aids, wetting agents, flatting agents, dyes, ultraviolet absorbers, pigments (particularly clays), particulate materials, e.g., microspheres and microballoons, can be added to the compositions of the invention in amounts and for purposes that are well known. Monoethylenically unsaturated compounds can also be incorporated to modify the flexibility and image adhesion properties of the abhesive coatings. Examples of such modifying compounds include vinyl benzoate, methacrylic acid, acrylamide, dimethyl itaconate, acrylonitrile octyl acrylate, 2-ethylhexyl acrylate, dodecyl methacrylate, octadecyl acrylate, and the like.

When visible light or ultraviolet radiation is used to cure the compositions, it is generally necessary to include a source of free radicals, i.e. a material which liberates free radicals on exposure to radiation. Such free radical sources are well known and are described in the art, e.g. "Photochemistry" by Calvert and Pitts, John Wiley & Sons, Chapter II (1966). For example, when ultraviolet radiation is utilized, suitable sources of free radicals include such compounds as acyloin and derivatives thereof, e.g. benzoin ethyl ether. Other sources of free radicals are disclosed in U.S. Pat. Nos. 3,887,450; 3,895,949; 4,043,819; 3,729,313 and 4,058,401. The free radical source can be used in amounts ranging from about 0.01 to 5 percent and preferably about 0.25 to 1.0 percent by weight of the total composition.

When visible light is utilized as the source of actinic radiation it is generally necessary that the composition also contain, in addition to the free radical source, a sensitizer capable of absorbing radiation of a wavelength present in the visible light and transferring the absorbed energy to the free radical source. Suitable sensitizers include cyanine, merocyanines, styryl and like dyes such as are described in U.S. Pat. No. 3,099,558.

The coating compositions of the present invention are found to be of use in providing substrates with a strongly adhering abhesive coating. Such substrates include metal, e.g. steel, nickel, aluminum; plastics, e.g., polyester, polycarbonate, polymethyl methacrylate, polyvinyl chloride, polyurethane, epoxy resins, phenolformaldehyde resins, etc; rubber, wood, paper, glass, ceramic, and the like. In order to coat some substrates, such as polyester films, it is necessary to use primers, as is well known in the art.

After the coating composition is applied to the substrate by any of the techniques known in the art, such as, for example, spray, brush, dip, knife, curtain and the like coating processes, it can be cured by exposure to actinic radiation, i.e., visible light, ultraviolet, laser beam, electron beam, X-rays, gamma rays and the like. Preferably, the coatings are cured by exposure to an electron beam such as is provided by electron-curtain processors. Examples of such processors are the "Electro-curtain II Series" available from Energy Sciences, Inc., Woburn, Mass., and the "Dynamitron EBX" available from Radiation Dynamics, Inc., Melville, N.Y.

A particularly preferred use of the coating compositions of the present invention is in the image transfer process described in Applicant's copending commonly assigned patent application Ser. No. 151,643, now U.S. Pat. No. 4,383,878. In one embodiment of that invention the adhesive coating composition is coated on a support in normal fashion and exposed to an electron beam. The adhesive coated substrate can be imaged with, for example, a fused xerographic design. A strip of transparent polyester pressure sensitive tape can then be pressed onto the image, whereupon the image transfers to the adhesive tape. The adhesive tape can then be applied to other substrates to impart an image to those substrates. Adhesive coatings prepared acording to the instant application can carry an image, in particular a fused xerographic image, which is not easily smeared, such as by finger pressure, yet which can easily transfer to an adhesive tape surface for desired applications.

In order to more clearly disclose the nature of the present invention, the following examples are presented. It should be understood, however, that these examples are intended neither to delineate the scope of the invention nor limit the ambit of the appended claims. In the examples, the process of preparing the coating compositions described above, was employed, and the quantities of material are expressed in terms of percentages by weight of the total composition, unless otherwise specified.

EXAMPLES 1-10

Mixtures of 4 g of each film-forming polymer listed in Table I, 1 g of N-ethylheptadecafluorooctanesulfonamidoethyl acrylate (NEF), prepared according to the procedures described hereinabove, and 4 g of tris(2-acryloxyethyl)isocyanurate, available as SR®-368 from the Sartomer Co., West Chester, Pa., were dissolved in sufficient tetrahydrofuran to provide a readily coatable solution having a concentration of solids of between about 20 and 40 percent by weight. Each solution was knife coated onto unprimed 1.4 mil polyester film and onto 4 mil polyester film that had been primed with polyvinylidene chloride. The solvent was allowed to evaporate at room temperature for about one hour and the coating was cured by exposure to accelerated electrons in an electron curtain processor to 16M Rad at 175,000 electron volts (ev) at a web speed of 7.6 meters per minute under nitrogen atmosphere. The abhesive character of the coatings was measured as peel adhesion, i.e., the force required to remove an adhesive coated tape from the abhesive coating on primed polyester. A peel strength test was performed by knife coating, at a thickness of 8 mils, a 25% solution of an adhesive comprising 95.5 percent by weight poly(isooctyl)acrylate and 4.5 percent by weight acrylic acid in an 80:20 percent by volume mixture of heptane and isopropyl alcohol, onto the particular electron beam cured abhesive coating. The solvent was removed by maintaining the adhesive coating at room temperature for approximately 24 hrs., followed by five minutes at 65° C. Unprimed polyester, about 1.4 mil thick and 2.54 cm wide, was then pressed with a 2 Kg roller onto the adhesive coated surface. "180°-S-Peel" is the force required to remove this resultant adhesive tape using an attached spring scale at a rate of about 4 cm/sec such that the portion of tape removed comes back adjacent but not quite touching the portion still attached to the coating. For further explanation of the "180°-S-Peel" test, see U.S. Pat. No. 4,157,418. The values of the "180°-S-Peel" test are recorded in Table I and are within a range taught to be useful by the prior art, i.e., between about 115 and 725 grams per centimeter. The values obtained in the "180°-S-Peel" tests illustrate that the cured coatings have a high degree of abhesiveness despite the relatively small amount of polyfluorinated acrylate compound utilized. It should be noted that the data reported in Table I is the average of two or three trials.

Any alteration of the adhesive character of the tape after contact with an abhesive surface was determined by a "Readhesion" test. This test was performed with the adhesive coated tape resulting from the "180°-S-Peel" test by pressing it onto a glass plate that has been cleaned by wiping with diacetone alcohol, and then heptane. The force required to remove the tape by the method described for the "180°-S-Peel" test is the "Readhesion" force. Readhesion values with the solvent based acrylic adhesive (designated "S-Readhesion") of less than about 40 oz/in (445 g/cm) after contact with the abhesive surface tend to indicate that the adhesive surface was contaminated with abhesive material removed from the abhesive coated layer. The values of "S-Readhesion" recorded in Table I indicate that the adhesive surfaces were not contaminated with abhesive materials. This lack of contamination by the abhesive material illustrates that the components of the abhesive compositions, after curing, are highly incorporated into the crosslinked network.

"Extractable %" was measured by removing a portion of each cured abherent coating from an unprimed polyester substrate, weighing it, and extracting it with tetrahydrofuran at room temperature for 24 hours. The insoluble residues were dried and weighed and the percent of extracted material was calculated. The insoluble residue was then analyzed for fluorine content according to the procedure described in Analytical Chemistry, 41, 107 (1969), and the amount of polyfluorinated acrylate incorporated into the cured coating, designated F. C. Inc. (fluorine compound incorporated) in Table I, as a percentage of that originally present in the coating composition was calculated. The "Extractable %" reported in Table I illustrates the solvent resistance (even in a strong solvent such as tetrahydrofuran) of the cured adhesive coatings, since very little of the coating material was extractable. The values of "F. C. Inc." indicate that in most cases almost all of the polyfluorinated acrylate that was originally present in the coating composition was incorporated in the crosslinked network of the cured coating.

TABLE I

| Ex. No. | Film Forming Polymer | Extractable % | F.C. Inc. % | 180°-S-Peel g/cm | S-Readhesion g/cm |
|---|---|---|---|---|---|
| 1. | Poly(MMA/EA/AA) [a] | 4.3 | 93.8 | 425 | 470 |
| 2. | Polycaprolactone triol [b] | * | * | 380 | 485 |
| 3. | Poly(MMA/EA) [c] | 20.0 | 92.4 | 435 | 470 |
| 4. | Gantrez® ES225 [d] | 18.1 | 91.0 | 485 | 470 |
| 5. | Poly(styrene/isoprene [e] | 7.7 | 95.9 | 390 | 485 |
| 6. | Poly(epichlorohydrinethyleneoxide) [f] | 8.8 | 99.8 | 445 | 560 |
| 7. | Polyesterurethane [g] | 1.2 | 98.8 | 600 | 670 |
| 8. | Polyisoprene [h] | 1.9 | 99.8 | 460 | 470 |
| 9. | Poly(styrene/acrylonitrile) [i] | 8.9 | 97.2 | 600 | 435 |

TABLE I-continued

| Ex. No. | Film Forming Polymer | Extractable % | F.C. Inc. % | 180°-S-Peel g/cm | S-Readhesion g/cm |
|---|---|---|---|---|---|
| 10. | Ethyl cellulose [j] | 5.3 | 93.7 | 420 | 460 |

[a] Carboset® 525 a methyl methacrylate-ethyl acrylate polymer containing 15 mole percent of acrylic acid available from B. F. Goodrich
[b] PCP 0300® available from Union Carbide
[c] Acryloid® B-82, poly(methyl methacrylate/ethyl acrylate-53/47) available from Rohm & Haas Co.
[d] Monoethyl ester of poly(methylvinyl ether/maleic anhydride) available as Gantrez® ES225 from GAF
[e] Kraton® 1107 available from Shell Corp.
[f] Hydrin® 200 available from B. F. Goodrich
[g] E625M® available from Thiokol Corp.
[h] Available from Shell Corporation
[i] Tyril® available from Dow Chem. Co.
[j] Available from the Hercules Co.

EXAMPLES 11-32

The coating procedures of Examples 1-10 were repeated using the poly(fluorooxyalkylene)acrylates listed in Table II in the quantities indicated. The poly(fluorooxyalkylene)acrylates were prepared according to the procedures described hereinabove. Once coated on primed polyester, the coatings were exposed to 16M Rad of electron beam radiation at 175,000 electron volts at a web speed of 7.6 meters per minute under a nitrogen atmosphere. "180-S-Peel" tests were performed on the cured coatings and the values obtained are recorded in Table II. The "180-S-Peel" strength values illustrate that the cured coatings have a high degree of abhesiveness despite the relatively small amount of poly(fluorooxyalkylene)acrylate utilized.

TABLE II

| Ex. No. | Fluorocarbon Acrylate Compound* | Parts | (Wt %) | Film-Forming Polymer Compound | Parts | (Wt %) | Crosslinking Agent | Parts | (Wt %) | 180°-S-Peel (g/cm) |
|---|---|---|---|---|---|---|---|---|---|---|
| 11 | A | 2.20 | (11.0) | E625M® | 8.88 | (44.6) | SR® 368 | 8.85 | (44.4) | 300 |
| 12 | B | 2.20 | (11.0) | " | 8.88 | (44.6) | " | 8.85 | (44.4) | 155 |
| 13 | B | 0.44 | (2.5) | " | 8.4 | (47.5) | " | 8.85 | (50.0) | 110 |
| 14 | C | 2.20 | (11.0) | " | 8.88 | (44.6) | " | 8.85 | (44.4) | 265 |
| 15 | D | 2.00 | (10.0) | " | 12.0 | (60.0) | " | 6.0 | (30.0) | 425 |
| 16 | E | 2.00 | (10.0) | " | 12.0 | (60.0) | " | 6.0 | (30.0) | 455 |
| 17 | F | 5.65 | (23.9) | " | 12.0 | (50.7) | " | 6.0 | (25.4) | 390 |
| 18 | G | 2.00 | (10.0) | " | 12.0 | (60.0) | " | 6.0 | (30.0) | 155 |
| 19 | G | 1.02 | (5.4) | " | 12.0 | (63.1) | " | 6.0 | (31.5) | 165 |
| 20 | G | 0.50 | (2.7) | " | 12.0 | (64.9) | " | 6.0 | (32.4) | 165 |
| 21 | G | 0.254 | (1.4) | " | 12.0 | (65.7) | " | 6.0 | (32.9) | 200 |
| 22 | G | 0.104 | (0.6) | " | 12.0 | (66.3) | " | 6.0 | (33.1) | 245 |
| 23 | G | 0.054 | (0.3) | " | 12.0 | (66.5) | " | 6.0 | (33.2) | 290 |
| 24 | G | 0.018 | (0.1) | " | 12.0 | (66.6) | " | 6.0 | (33.3) | 615 |
| 25 | H | 2.00 | (10.0) | E625M® | 12.0 | (60.0) | SR® 368 | 6.0 | (30.0) | 355 |
| 26 | H | 1.007 | (5.3) | " | 12.0 | (63.1) | " | 6.0 | (31.6) | 290 |
| 27 | H | 0.516 | (2.8) | " | 12.0 | (64.8) | " | 6.0 | (32.4) | 425 |
| 28 | H | 0.110 | (0.6) | " | 12.0 | (66.3) | " | 6.0 | (33.1) | 380 |
| 29 | H | 0.055 | (0.3) | " | 12.0 | (66.5) | " | 6.0 | (33.2) | 345 |
| 30 | H | 0.027 | (0.15) | " | 12.0 | (66.57) | " | 6.0 | (33.28) | 455 |
| 31 | I | 0.111 | (0.5) | " | 12.0 | (66.3) | " | 6.0 | (33.1) | 290 |
| 32 | J | 2.00 | (10.0) | " | 12.0 | (60.0) | " | 6.0 | (30.0) | 425 |

*

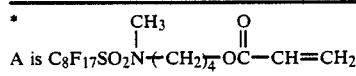

A is $C_8F_{17}SO_2N(CH_3)(CH_2)_4OC(O)-CH=CH_2$

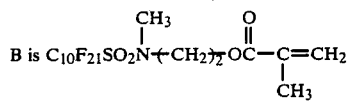

B is $C_{10}F_{21}SO_2N(CH_3)(CH_2)_2OC(O)-C(CH_3)=CH_2$

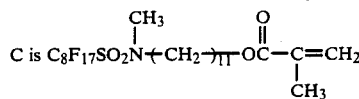

C is $C_8F_{17}SO_2N(CH_3)(CH_2)_{11}OC(O)-C(CH_3)=CH_2$

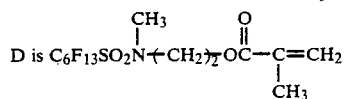

D is $C_6F_{13}SO_2N(CH_3)(CH_2)_2OC(O)-C(CH_3)=CH_2$

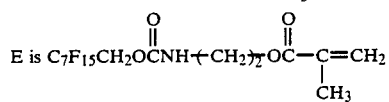

E is $C_7F_{15}CH_2OC(O)NH(CH_2)_2OC(O)-C(CH_3)=CH_2$

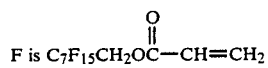

F is $C_7F_{15}CH_2OC(O)-CH=CH_2$

TABLE II-continued

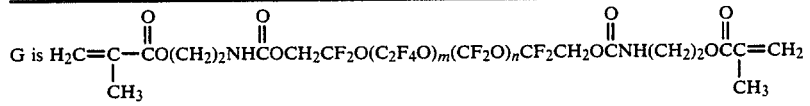

wherein m/n has an average value of about 0.5 and wherein the compound has a number average molecular weight of about 4690;

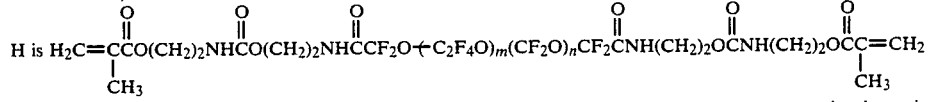

wherein m/n has an average value of about 0.6 and wherein the compound has a number average molecular weight of about 2310; and

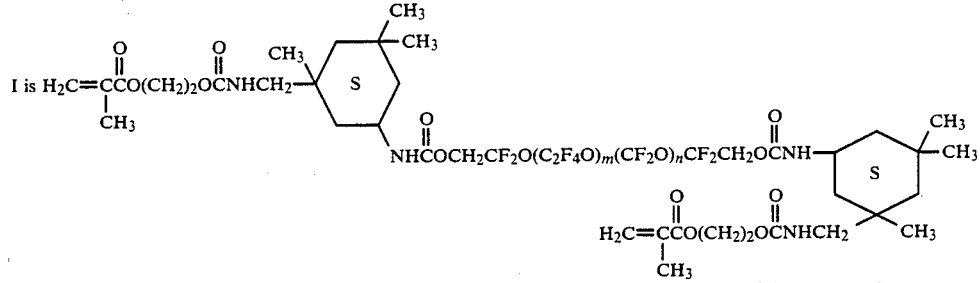

wherein m/n has an average value of about 0.5 and the number average molecular weight of the compound is about 5450.

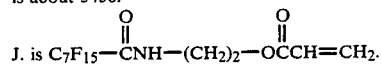

EXAMPLES 33-49

Abherent coatings were prepared as recorded in Table III according to the procedures of Examples 1-10. The coating compositions of Examples 33, 34, 38, 40, 42, 44, 46, 48 and 49 contained no crosslinking agent. The coating compositions of Examples 33 and 37 contained no polyfluorinated acrylate. The results of "180°-S-Peel" strength and "S-Readhesion" tests performed on the cured coating compositions on primed polyester are also recorded in Table III.

Examples 33, 34, 37, 38, 40, 42, 44, 46, 48 and 49 illustrate that the coating compositions of the present invention must comprise both polyfluorinated acrylate and crosslinking agent in order to provide cured abherent coatings having useful release characteristics, i.e., "180°-S-Peel" of about 115 to 725 g/cm (about 10 to 65 ounces/inch).

Examples 39, 41, 43 and 45 illustrate that for the polymers utilized in those examples more crosslinker is required to produce cured coatings with useful abhesive strengths than is the case with the polymers utilized in the other examples.

TABLE III

| Ex. No. | Film-Forming Polymer Parts | (wt %) | Polyfluorinated methacrylate (NEF) Parts | (wt %) | Crosslinking agent SR®-368 Parts | (wt %) | 180°-S-Peel g/cm | S-Readhesion g/cm |
|---|---|---|---|---|---|---|---|---|
| 33 | Polyesterurethane [g] 4 | (100.0) | 0 | (0.0) | 0 | (0.0) | (2) | — |
| 34 | Polyesterurethane [g] 4 | (80.0) | 1 | (20.0) | 0 | (0.0) | (2) | — |
| 35 | Polyesterurethane [g] 7 | (70.0) | 1.5 | | 1.5 | (15.0) | 400 | 360 |
| 36 | Polyesterurethane [g] 4 | (44.4) | 1 | (11.1) | 4 | (44.5) | 325 | 625 |
| 37 | Polyesterurethane [g] 4 | (50.0) | 0 | (0.0) | 4 | (50.0) | (2) | — |
| 38 | Poly(MMA/n-BuMA) [k] 4 | (80.0) | 1 | (20.0) | 0 | (0.0) | (2) | — |
| 39 | Poly(MMA/n-BuMA) [k] 4 | (30.8) | 1 | (7.7) | 8 | (61.5) | 490 | 445 |
| 40 | Chlorinated Polypropylene [l] 4 | (80.0) | 1 | (20.0) | 0 | (0.0) | (2) | — |
| 41 | Chlorinated Polypropylene [l] 4 | (30.8) | 1 | (7.7) | 8 | (61.5) | 425 | 470 |
| 42 | Poly(styrene/MMA) [m] 4 | (80.0) | 1 | (20.0) | 0 | (0.0) | (2) | — |
| 43 | Poly(styrene/MMA) [m] 4 | (30.8) | 1 | (7.7) | 8 | (61.5) | 635 | 490 |
| 44 | Cl natural rubber [n] 4 | (80.0) | 1 | (20.0) | 0 | (0.0) | (2) | — |
| 45 | Cl natural rubber [n] 4 | (30.8) | 1 | (7.7) | 8 | (61.5) | 725 | 490 |
| 46 | Poly(styrene/isoprene) [e] 4 | (80.0) | 1 | (20.0) | 0 | (0.0) | (2) | — |
| 47 | Poly(styrene/isoprene) [e] 4 | (44.4) | 1 | (11.1) | 4 | (44.5) | 390 | 485 |
| 48 | Poly(vinylidene chloride/acrylonitrile) [o] 4 | (80.0) | 1 | (20.0) | 0 | (0.0) | 770 | 370 |
| 49 | Polyvinylacetate [p] 4 | (80.0) | 1 | (20.0) | 0 | (0.0) | (1) | 335 |

(1) Adhesive splits between coating and support
(2) Adhesive adheres to the coating (i.e., separates from the polyester support layer)
[g] E625M ® available from Thiokol Corp.
[k] Elvacite ® 2013 available from DuPont Co.
[l] Available from Hercules Chem. Co.
[m] Available from Richardson Co.
[n] Parlon S-125 available from Hercules Chem. Co.
[e] Kraton ® 1107 available from Shell Corp.
[o] Saran ® F-210 available from Dow Chem. Co.
[p] Polyvinyl acetate available from Aldrich Chem. Co.

EXAMPLES 50-61

Abhesive coating compositions were prepared as described in Examples 1-10 using 8 parts of polyesterurethane available as E625M ® from Thiokol Corp., 2 parts of N-ethylheptadecafluorooctanesulfonamidoethyl acrylate (NEF) and 1, 3, 5 and 8 parts of a crosslinking agent, either pentaerylthritol tetraacrylate, trimethylolpropane trimethacrylate, or pentaerythritol triacrylate available as SR ®-295, SR ®-350 and SR ®-444, respectively from the Sartomer Co. and electron beam cured at 150 Kev, 4M Rad at a web speed of 7.6 meters per minute under a nitrogen atmosphere. The "180°-S-Peel" and "S-Readhesion" values were determined for the abhesive coatings on primed polyester, and are given in Table IV.

The "180°-S-Peel" strength for samples cured under the same conditions does not significantly vary over the range of crosslinking agent concentration from about 9 to about 45 percent.

TABLE IV

| Ex. No. | Crosslinking Agent Parts (wt %) | Film-Forming Polymer (E625M ®) Parts (wt %) | Polyfluoroalkyl Acrylate (NEF) Parts (wt %) | 180°-S-Peel g/cm | S-Readhesion g/cm |
|---|---|---|---|---|---|
| 50 | SR ®-295 1 (9.1) | 8 (72.7) | 2 (18.2) | 280 | 535 |
| 51 | SR ®-295 3 (23.1) | 8 (61.5) | 2 (15.4) | 300 | 625 |
| 52 | SR ®-295 5 (33.3) | 8 (53.4) | 2 (13.3) | 300 | 570 |
| 53 | SR ®-295 8 (44.4) | 8 (44.5) | 2 (11.1) | 310 | 625 |
| 54 | SR ®-350 1 (9.1) | 8 (72.7) | 2 (18.2) | 260 | 425 |
| 55 | SR ®-350 3 (23.1) | 8 (61.5) | 2 (15.4) | 300 | 560 |
| 56 | SR ®-350 5 (33.3) | 8 (53.4) | 2 (13.3) | 335 | 560 |
| 57 | SR ®-350 8 (44.4) | 8 (44.5) | 2 (11.1) | 270 | 535 |
| 58 | SR ®-444 1 (9.1) | 8 (72.7) | 2 (18.2) | 290 | 550 |
| 59 | SR ®-444 3 (23.1) | 8 (66.5) | 2 (15.4) | 270 | 600 |
| 60 | SR ®-444 5 (33.3) | 8 (53.4) | 2 (13.3) | 280 | 560 |
| 61 | SR ®-444 8 (44.4) | 8 (44.5) | 2 (11.1) | 310 | 590 |

EXAMPLES 62-67

Abherent coating compositions were prepared according to the procedures of Examples 1-10, containing 15% by weight SR ®-368, and varying concentrations of NEF and polyesterurethane, as indicated in Table V. "180-S-Peel" was determined for each cured coating composition coated on primed polyester (Table V).

TABLE V

| Ex. No. | Polyesterurethane* (% by weight) | NEF (% by weight) | "180-S-Peel" (g/cm) |
|---|---|---|---|
| 62 | 83 | 2 | 335 |
| 63 | 80 | 5 | 370 |
| 64 | 75 | 10 | 380 |
| 65 | 65 | 20 | 335 |
| 66 | 55 | 30 | 335 |
| 67 | 50 | 35 | 330 |

*available as E-625M ® from the Thiokol Corp.

Table V illustrates that only a small amount of the polyfluorinated acrylate, N-ethylheptadecafluorooctanesulfonamidoethyl acrylate (NEF) is required to prepare abherent coatings having useful "180-S-Peel" strengths.

EXAMPLE 68

Preparation of

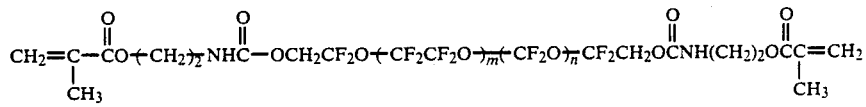

wherein the product comprises a mixture in which m/n has an average value of about 0.5 and the number average molecular weight of the compound is about 4690. Into a 100 ml flask equipped with a mechanical stirrer and a drying tube was placed 43.6 g of $$HOCH_2CF_2O(CF_2CF_2O)_m(CF_2O)_nCF_2CH_2OH,$$

wherein the dihydroxy material comprises a mixture in which m/n has an average value of about 0.5 with the resultant OH equivalent weight being 2180, and 3.1 g of 2-isocyanatoethyl methacrylate. Stirring yielded a heterogeneous mixture. Dibutyl tin dilaurate (0.055 g) was then added to the stirring mixture and after 4-5 minutes a slight exotherm was noted. Stirring was continued for 1-2 hours. The resultant product was clear and colorless. Infrared spectra confirmed the structure of the product and indicated that it contained no unreacted isocyanate.

EXAMPLE 69

Preparation of

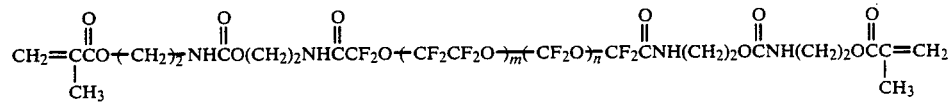

wherein the product comprises a mixture in which m/n has an average value of about 0.6 and the number average molecular weight of the compound is about 2310.

According to the procedure of Example 68, 40.0 g of

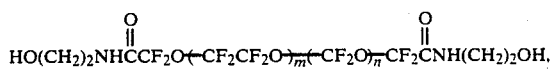

wherein m/n has an average value of about 0.6 and a number average molecular weight of about 2000, and 6.5 g of 2-isocyanatoethyl methacrylate were mixed. Dibutyl tin dilaurate (0.088 g) was then added to the mixture as in Example 68, and the mixture was cooled in an ice/water bath until the exothermic reaction subsided, about 30 min. Infrared analysis confirmed the structure of the product.

EXAMPLE 70

Preparation of

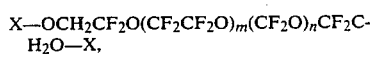
X—OCH$_2$CF$_2$O(CF$_2$CF$_2$O)$_m$(CF$_2$O)$_n$CF$_2$C-H$_2$O—X, wherein X is

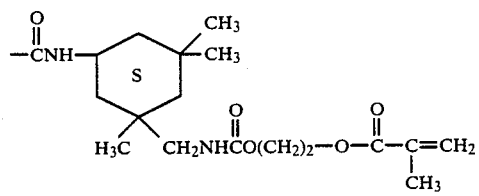

and wherein the product comprises a mixture in which m/n has an average value of about 0.5 and the number average molecular weight of the compound is about 5450. Into a 100 ml flask equipped with a mechanical stirrer and a drying tube was placed 21.8 g of HOCH$_2$-F$_2$-(-CF$_2$CF$_2$O-)$_m$-(-CF$_2$O-)$_n$CF$_2$CH$_2$OH (as in Example 68), 5.5 g of

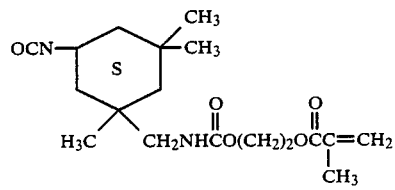

(NCO equivalent wt. 543.5)

and 0.055 g of dibutyl tin dilaurate. The mixture was stirred and heated to about 65° C. (oil bath temperature) for a period of 1.5-2 hours. The structure of the product was confirmed by infrared spectral analysis which also indicated that no unreacted isocyanate remained.

What is claimed is:

1. A radiation curable composition for providing solvent-resistant adhesive coatings comprising:
   (A) a poly(fluorooxyalkylene)acrylate or methacrylate compound having the general formula

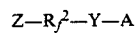
   Z—R$_f^2$—Y—A wherein

R$_f^2$ is a divalent poly(fluorooxyalkylene) group having a number average molecular weight of from about 500 to 20,000;

A is selected from the group consisting of

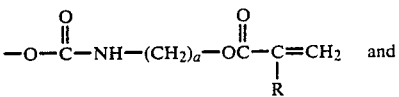

and

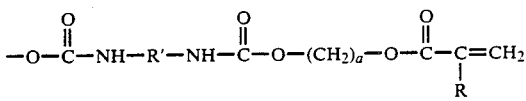

wherein:
R is selected from the group consisting of hydrogen and methyl, a is an integer having a value of 2 to 6, and R' is selected from the group consisting of a divalent aliphatic or cycloaliphatic group having 2 to 14 carbon atoms and an aryl group having 6 to 14 carbon atoms;

Y is selected from the group consisting of —CH$_2$— and

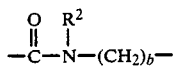

wherein:
b is 2 to 12, R$^2$ is selected from the group consisting of hydrogen, a lower alkyl of about 1 to 4 carbon atoms, and —(CH$_2$)$_c$A, wherein A is defined as said A hereinabove, c is 2 or 3, and wherein, when R$^2$ is —(CH$_2$)$_c$A, b is 2 or 3; and Z is selected from the group consisting of CF$_3$O—, CF$_3$OCF(CF$_3$)O—, and —Y—A, wherein Y and A are defined as said Y and A hereinabove;

(B) a polyethylenically unsaturated crosslinking agent which differs from said poly(fluorooxyalkylene) acrylate or methacrylate compound; and (C) 50 to 85 percent by weight of a nonfluorinated, non-moisture reactive thermoplastic film-forming polymer;

wherein all fluorine present in said composition is provided by said poly(fluorooxyalkylene) acrylate or methacrylate compound which is present in said composition in a concentration of between about 0.2 and 5 percent by weight of said composition.

2. The composition of claim 1 wherein said R$_f^2$ comprises the unit —CF$_2$—O-(-CF$_2$CF$_2$O-)$_m$-(-CF$_2$O-)$_n$CF$_2$— wherein m and n are whole numbers having values between about 1 and 200 and the ratio m/n is between about 0.2/1 and 5/1.

3. The composition of claim 1 wherein said poly(fluorooxyalkylene)urethane acrylate or methacrylate is selected from the group consisting of

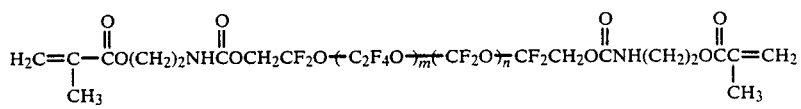

wherein m/n has an average value of about 0.5 and the number average molecular weight of the compound is about 4690;

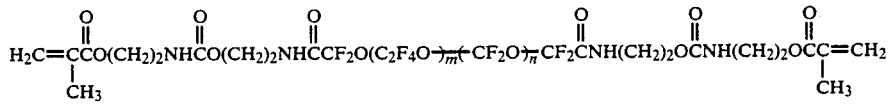

wherein m/n has an average value of about 0.6 and the number average molecular weight of the compound is about 2310; and

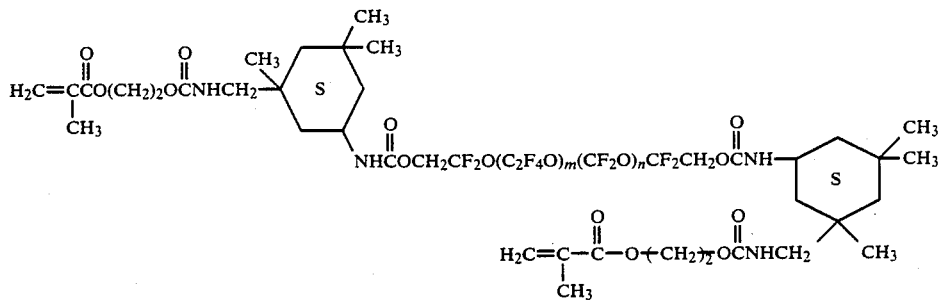

wherein m/n has an average value of about 0.5, and the number average molecular weight of the compound is about 5450.

4. The composition of claim 1 wherein said polyethylenically unsaturated crosslinking agent is selected from the group consisting of acrylic and methacrylic substituted compounds having an acrylic equivalent weight of about 63 to 275.

5. The composition of claim 1 wherein said polyethylenically unsaturated crosslinking agent is present in a concentration of about 10 to 50 percent by weight of said composition.

6. The composition of claim 1 wherein said film-forming polymer is a thermoplastic organic polymer which is dispellable with said polyfluorinated acrylate functional compound; and wherein said polymer is soluble in tetrahydrofuran and does not exhibit immediate phase separation when said polyfluorinated acrylate functional compound is dispelled into a solution of said polymer in tetrahydrofuran.

7. The composition of claim 6 wherein said film-forming polymer is selected from the group consisting of polyesters, polylactones, polyamides, vinyl polymers, polyolefins, polydienes, polyacrylates, polyurethanes and cellulosic derivatives.

8. The composition of claim 1 wherein said composition further comprises additives selected from the group consisting of coating aids, wetting agents, flatting agents, dyes, ultraviolet absorbers, pigments, particulate materials, monoethylenically unsaturated modifying compounds, and mixtures thereof.

9. The composition of claim 1 wherein said composition also comprises a source of free radicals.

10. The composition of claim 9 wherein said composition further comprises a sensitizer, said sensitizer being capable of absorbing radiation of a wavelength present in visible light and transferring the absorbed energy to said free radical source.

11. A solvent-resistant abhesive coating comprising the radiation curable composition of claim 1 wherein said composition has been coated and subsequently radiation cured.

12. An article comprising a substrate having the radiation curable coating composition of claim 1 carried thereon.

13. The article of claim 12 wherein said substrate is selected from the group consisting of metals, plastics, rubber, wood, paper, glass, ceramic and the like.

14. An article according to claim 12 wherein said coating composition has been radiation cured.

* * * * *

UNITED STATES PATENT AND TRADEMARK OFFICE
CERTIFICATE OF CORRECTION

PATENT NO. : 4,985,473
DATED : January 15, 1991
INVENTOR(S) : Brian H. Williams and Chung-I Young It is certified that error appears in the above-identified patent and that said Letters Patent is hereby corrected as shown below:

Col. 8, line 17, "is of the Formula" should read --A is of the Formula--.

Cols. 7-8, line 50, "$CF_3O(C_3F_6O)_5(-CF_2-\overset{O}{\overset{\|}{C}}HN-(CH_2)_2O-\overset{O}{\overset{\|}{C}}NH-$" should read --$CF_3O(C_3F_6O)_5(CF_2O)_4CF_2-\overset{O}{\overset{\|}{C}}NH-(CH_2)_2O-\overset{O}{\overset{\|}{C}}NH-$--.

Col. 8, line 61, after "include:" insert

--$H_2C=\underset{R}{\overset{}{C}}-\overset{O}{\overset{\|}{C}}O-CH_2-CF_2O(CF_2CF_2O)_8(CF_2O)_{14}CF_2-CH_2-O-\overset{O}{\overset{\|}{C}}-\underset{R}{\overset{}{C}}=CH_2$--.

Signed and Sealed this

Twenty-fifth Day of August, 1992

*Attest:*

DOUGLAS B. COMER

*Attesting Officer*    *Acting Commissioner of Patents and Trademarks*